(12) United States Patent
Nakao et al.

(10) Patent No.: US 8,519,265 B2
(45) Date of Patent: Aug. 27, 2013

(54) POWER MODULE

(75) Inventors: Junichi Nakao, Hyogo-ken (JP); Hiroshi Fukuyoshi, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 347 days.

(21) Appl. No.: 12/885,393

(22) Filed: Sep. 17, 2010

(65) Prior Publication Data

US 2011/0069458 A1 Mar. 24, 2011

(30) Foreign Application Priority Data

Sep. 18, 2009 (JP) .................................. 2009-216417

(51) Int. Cl.
*H01R 13/46* (2006.01)

(52) U.S. Cl.
USPC ............. 174/59; 361/729; 361/760; 361/783; 361/752; 361/730

(58) Field of Classification Search
USPC ......... 361/729, 760, 783, 752, 730; 174/255, 174/257, 59
See application file for complete search history.

(56) References Cited

U.S. PATENT DOCUMENTS

| | | | | |
|---|---|---|---|---|
| 5,373,105 | A | * | 12/1994 | Nagaune et al. ............... 174/539 |
| 5,621,243 | A | * | 4/1997 | Baba et al. ...................... 257/712 |
| 5,763,946 | A | * | 6/1998 | Nakadaira et al. ............. 257/693 |
| 6,605,868 | B2 | | 8/2003 | Ishiwata et al. |
| 7,263,766 | B2 | | 9/2007 | Ishiwata et al. |
| 7,768,109 | B2 | | 8/2010 | Nakao |
| 2004/0140116 | A1 | * | 7/2004 | Bayerer et al. ................ 174/52.2 |
| 2007/0290305 | A1 | * | 12/2007 | Oyama et al. .................. 257/678 |

FOREIGN PATENT DOCUMENTS

| | | |
|---|---|---|
| CN | 101521167 A | 9/2009 |
| JP | 52-129378 | 10/1977 |
| JP | 10-256411 | 9/1998 |
| JP | 10-270609 | 10/1998 |
| JP | 2004-087540 | 3/2004 |
| JP | 2005-311019 | 11/2005 |
| JP | 2009-076887 | 4/2009 |
| JP | 2009200416 A | 9/2009 |

OTHER PUBLICATIONS

Japanese Office Action dated Jun. 29, 2012, filed in Japanese counterpart Application No. 2009-216417, 4 pages (with English translation).

Chinese Office Action dated Jul. 16, 2012, filed in Chinese counterpart Application No. 201010287754.1, 11 pages.

* cited by examiner

*Primary Examiner* — Tuan T Dinh
*Assistant Examiner* — Steven Sawyer
(74) *Attorney, Agent, or Firm* — Patterson & Sheridan, L.L.P.

(57) ABSTRACT

According to one embodiment, a power module includes a metal base, a ceramic substrate, a semiconductor chip, a nut holder housing a nut, an electrode terminal and a casing. The ceramic substrate is connected to an upper surface of the metal base via a lower electrode. The semiconductor chip is located on a first major surface of the ceramic substrate. The electrode terminal includes a bent portion surrounding a nut holder. The electrode terminal includes a first connecting portion extending perpendicularly to the bent portion from one end of the bent portion, and being located on the first major surface via an upper electrode, and electrically connected to the semiconductor chip. A casing is bonded to the metal base to enclose the semiconductor chip and the electrode terminal. An upper end portion of the bent portion of the electrode terminal is exposed to outside of the casing through the opening.

20 Claims, 11 Drawing Sheets

H1<H2
R>90°

POWER MODULE

CROSS-REFERENCE TO RELATED APPLICATIONS

This application is based upon and claims the benefit of priority from the prior Japanese Patent Application No. 2009-216417, filed on Sep. 18, 2009; the entire contents of which are incorporated herein by reference.

FIELD

Embodiments described herein relate generally to a power module.

BACKGROUND

In a power module, a semiconductor chip serving as a power device is mounted on a circuit board. The upper electrode of the circuit board is soldered to an electrode terminal. The lower electrode of the circuit board is soldered to a metal base. The gap portion between the circuit board and the casing is filled with e.g. silicone gel. In a power module such as an IGBT (insulated-gate bipolar transistor) module, in consideration of thermal conductivity, the circuit board is a ceramic substrate made of. e.g. AlN (aluminum nitride), and the metal base is made of e.g. Cu (copper), which has good thermal conductivity (see, e.g., JP-A-2005-311019).

In the power module as described in JP-A-2005-311019, the soldered electrode terminal is perpendicularly bent for mounting or other purposes. However, the problem is that bending using e.g. a specialized jig may fail to achieve bending at a right angle, and the height dimensional accuracy of the electrode terminal goes out of specification. Another problem is that bending causes stress on the soldering portion and decreases the reliability.

DETAILED DESCRIPTION

In general, according to one embodiment, a power module includes a metal base, a ceramic substrate, a semiconductor chip, a nut holder housing a nut, an electrode terminal and a casing. The ceramic substrate has a first major surface and a second major surface opposite to the first major surface, and the second major surface is connected to an upper surface of the metal base via a lower electrode. The semiconductor chip is located on the first major surface of the ceramic substrate. The electrode terminal includes a bent portion, and the nut holder is provided inside the bent portion so that outer periphery of the nut holder is surrounded by the bent portion from one end to another end of the bent portion. The electrode terminal includes a first connecting portion extending perpendicularly to the bent portion from the one end of the bent portion, and the first connecting portion is located on the first major surface of the ceramic substrate via an upper electrode and electrically connected to the semiconductor chip. The casing includes an upper plate having an opening and an annular side plate extending downward from an edge of the upper plate, the casing is bonded to an outer end portion of a first major surface of the metal base at an end of the side plate on opposite side from the upper plate, and the casing encloses the semiconductor chip and the electrode terminal. An upper end portion of the bent portion of the electrode terminal is exposed to outside of the casing through the opening.

Embodiments of the invention will now be described with reference to the drawings.

First Embodiment

Figure 1:
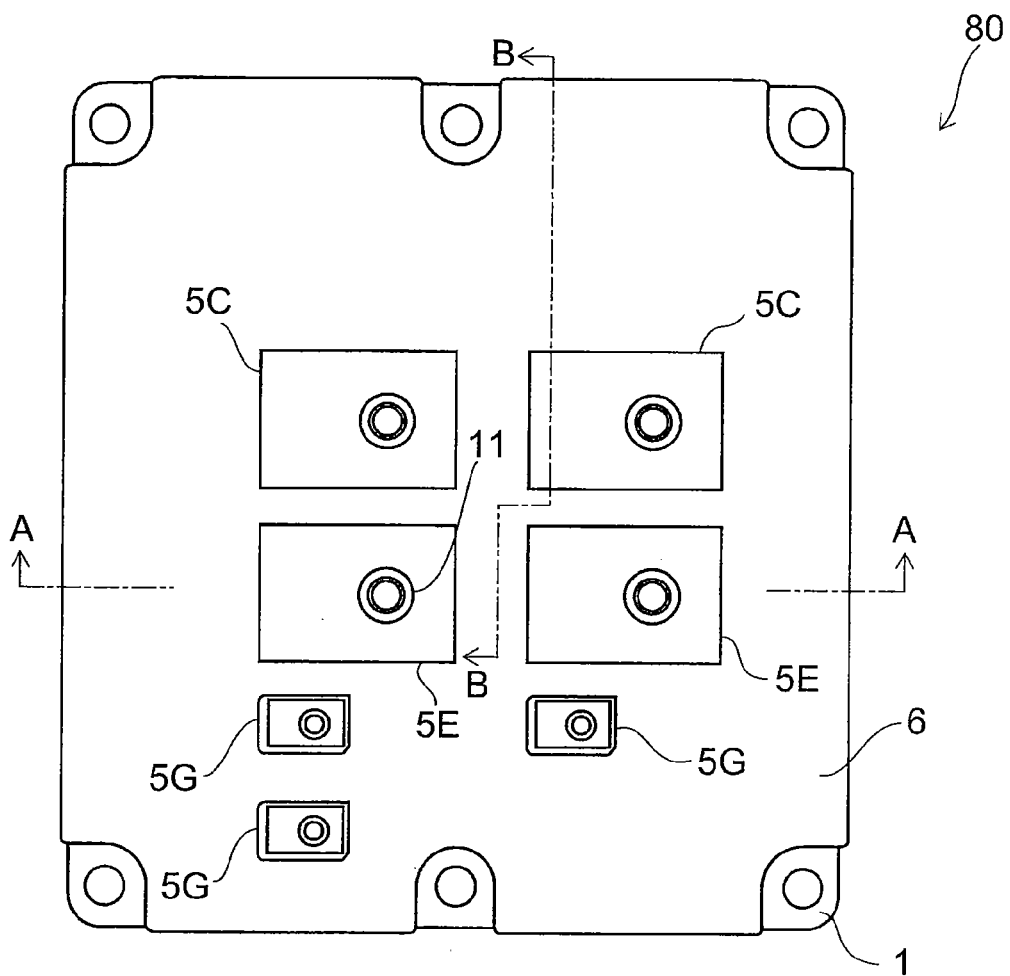
FIG. 1 is a plan view showing a power module according to a first embodiment of the invention.
Figure 2:
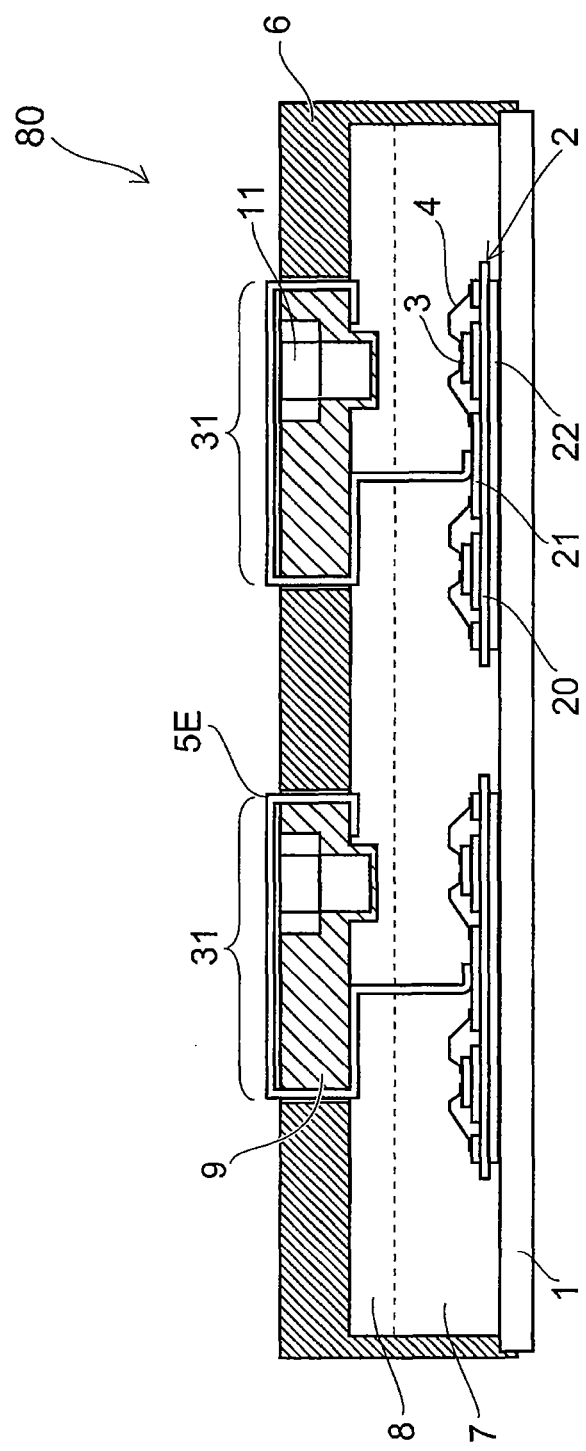
FIG. 2 is a cross-sectional view of the power module taken along line A-A in FIG. 1.
Figure 3:
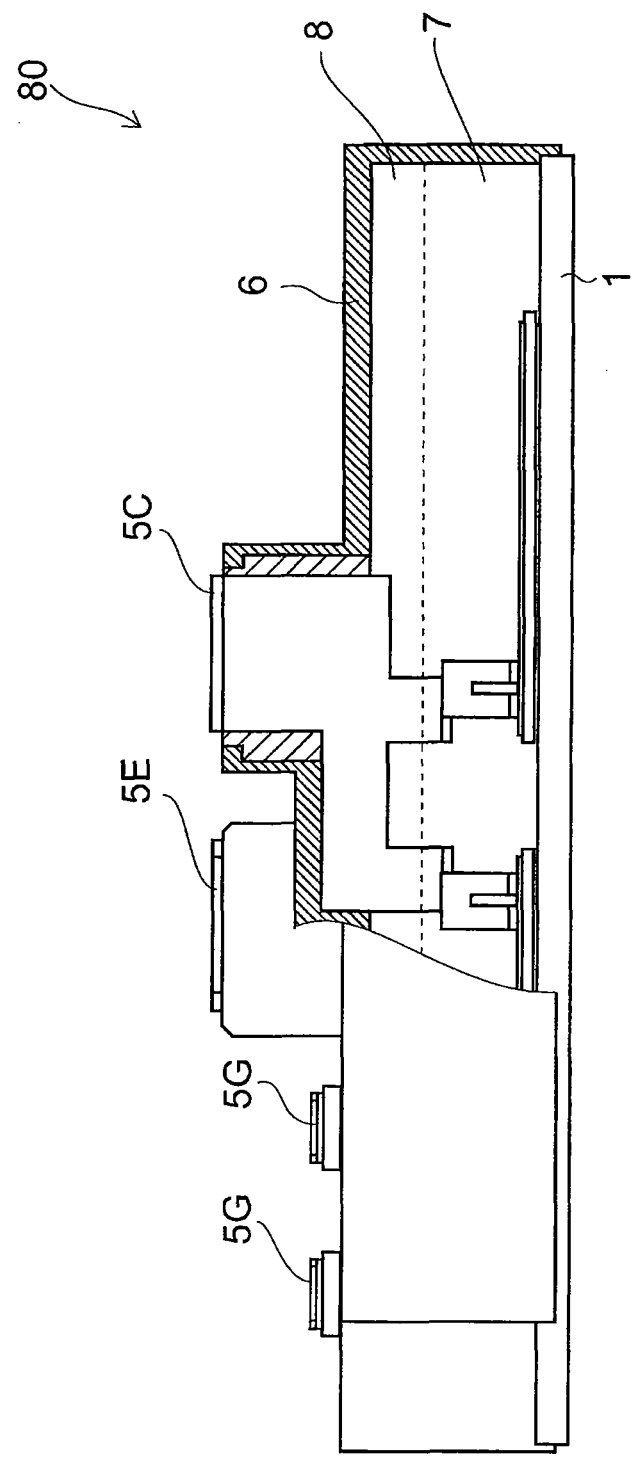
FIG. 3 is a cross-sectional view of the power module taken along line B-B in FIG. 1.
Figure 4:
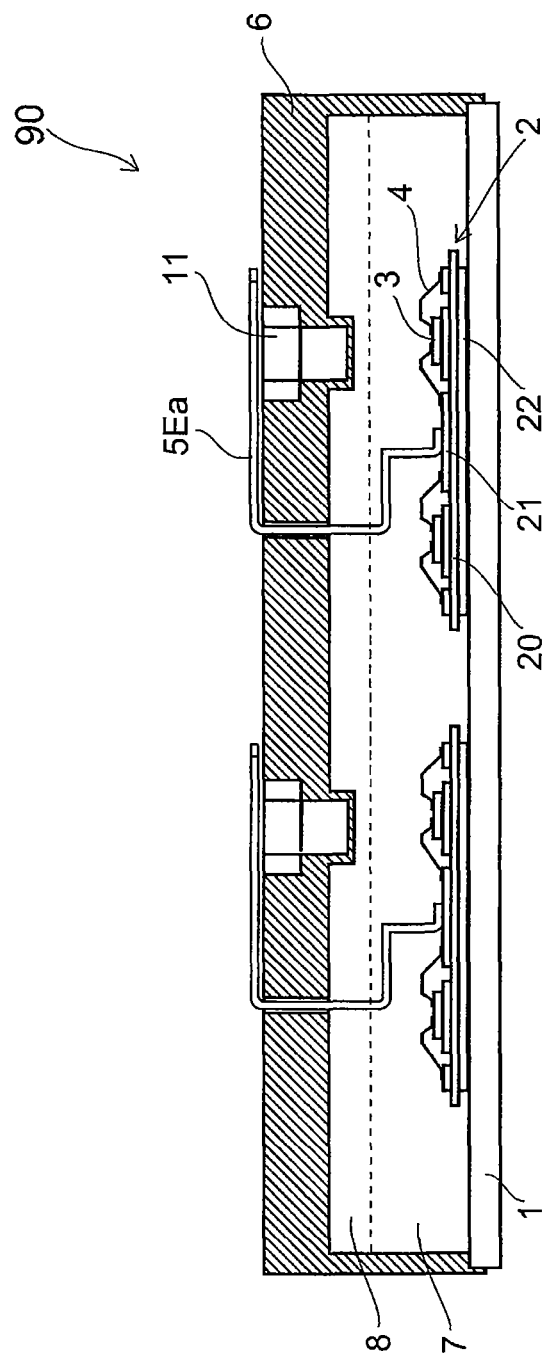
FIG. 4 is a cross-sectional view showing a power module of a comparative example the first embodiment of the invention.
Figure 5:
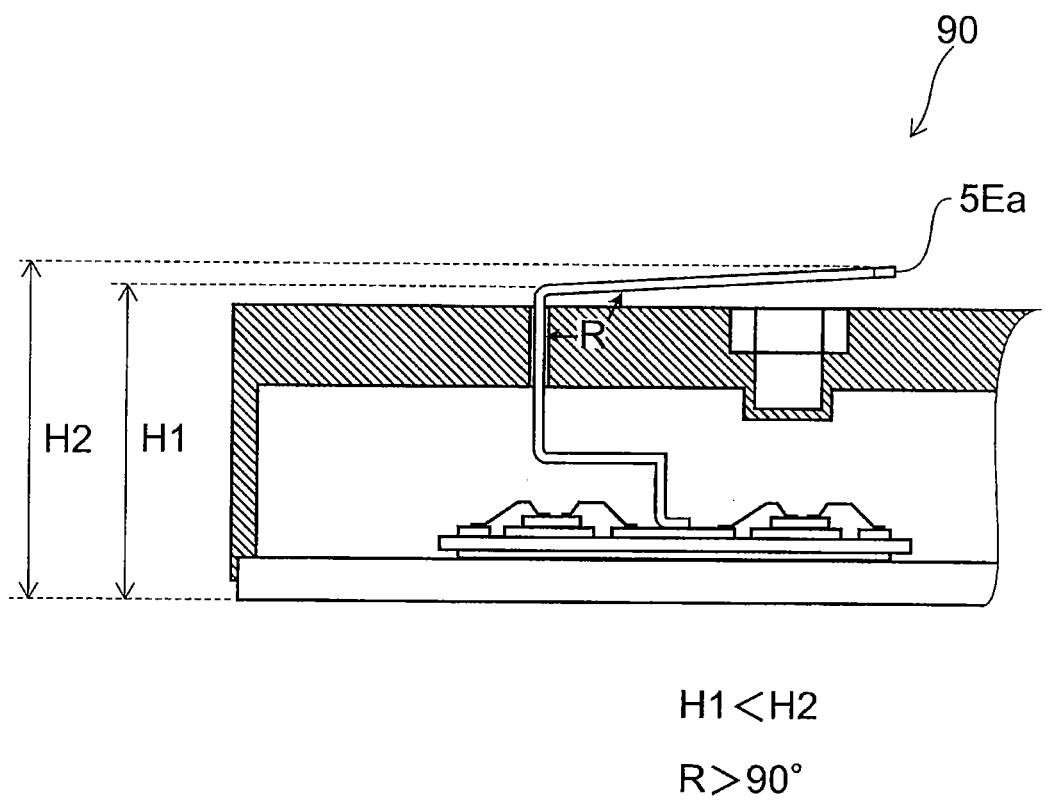
FIG. 5 is a cross-sectional view showing the shape of the electrode terminal of the power module of the comparative example immediately after bending.
Figure 6:
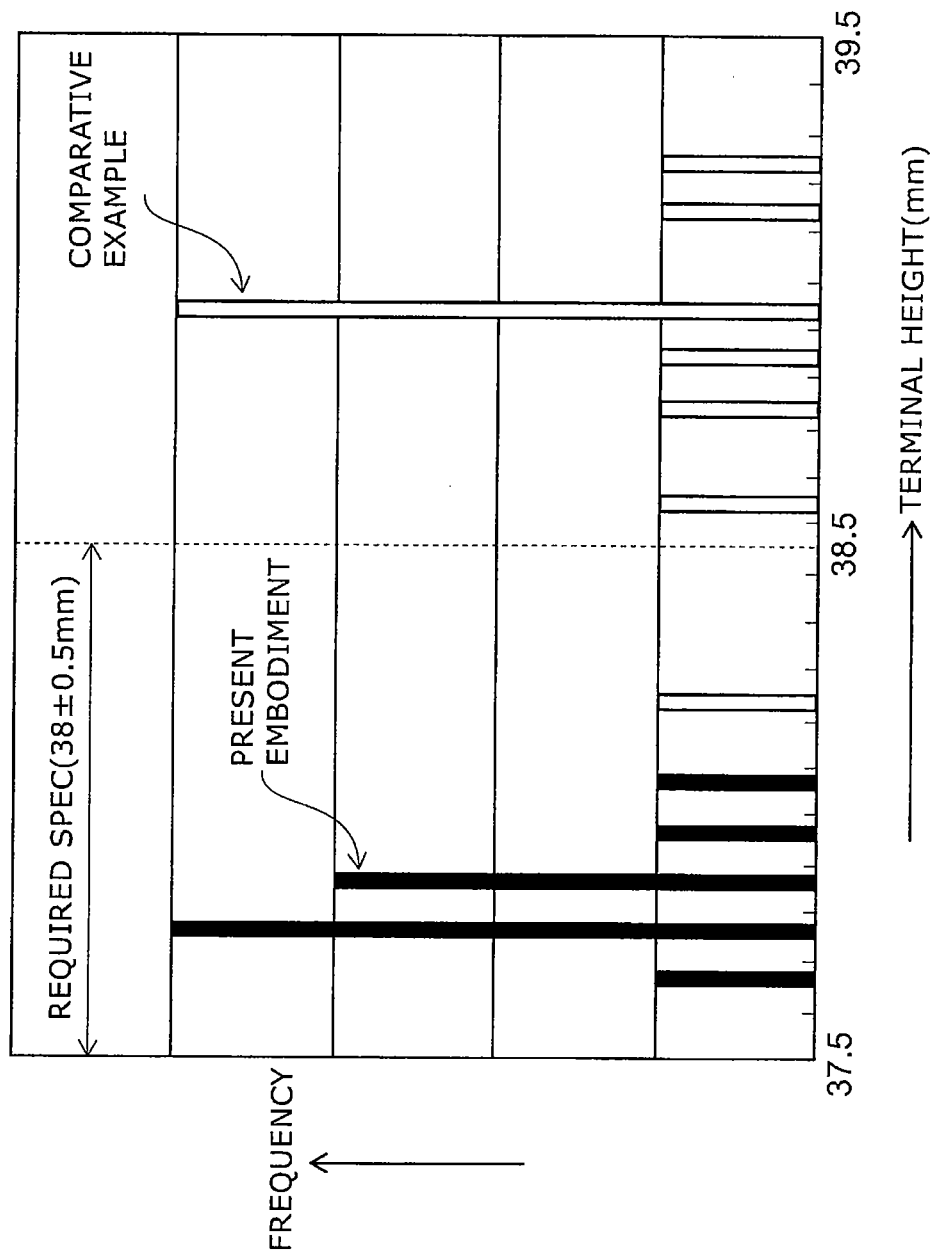
FIG. 6 shows variation in the height dimensional tolerance of the electrode terminal according to the first embodiment of the invention.

First, a power module according to a first embodiment of the invention is described with reference to the drawings. FIG. 1 is a plan view showing the power module. FIG. 2 is a cross-sectional view of the power module taken along line A-A in FIG. 1. FIG. 3 is a cross-sectional view of the power module taken along line B-B in FIG. 1. FIG. 4 is a cross-sectional view showing a power module of a comparative example. FIG. 5 is a cross-sectional view showing the shape of the electrode terminal of the power module of the comparative example immediately after bending. FIG. 6 shows variation in the height dimensional tolerance of the electrode terminal. In this embodiment, the electrode terminal has an electrode terminal bent portion, where the electrode terminal is bent beforehand into a square U shape. The electrode terminal is connected to the upper electrode of the circuit board. Then, a nut and a nut holder are housed inside the electrode terminal bent portion.

As shown in FIG. 1, at the bottom of the power module 80, a metal base 1 serving as a heat dissipating substrate is provided. On the upper surface of the power module 80, a plurality of electrode terminals including a collector electrode terminal 5C, an emitter electrode terminal 5E, and a signal terminal 5G, and nuts 11 are provided. The collector electrode terminal 5C, the emitter electrode terminal 5E, and the signal terminal 5G are each shaped like a rectangle as viewed from above. The collector electrode terminal 5C, the emitter electrode terminal 5E, and the signal terminal 5G are electrically connected to a semiconductor chip.

A resin casing 6 covers the power module 80. A plurality of nuts 11 are provided, each located in the region of the collector electrode terminal 5C, the emitter electrode terminal 5E, and the signal terminal 5G.

The power module 80 is an IGBT module, a kind of IPM (Intelligent Power Module) in which an IGBT (insulated-gate bipolar transistor) is used as a semiconductor chip mounted thereon. The power module 80 is used in e.g. inverter applications. In general, power modules such as IGBT power modules, power MOS modules, and diode modules have various applications including electric railroad, electric vehicle, inverter, and induction heating technologies.

As shown in FIG. 2, in the power module 80, a plurality of circuit boards 2 are mounted on the first major surface (front surface) of the metal base 1. Each circuit board 2 is composed of a ceramic substrate 20, an upper electrode 21, and a lower electrode 22. The upper electrode 21 is provided on the first major surface (front surface) of the ceramic substrate 20. The lower electrode 22 is provided on the second major surface (rear surface) of the ceramic substrate 20 opposite to the first major surface (front surface). A semiconductor chip 3, which is an IGBT, is mounted on the first major surface (front surface) of the circuit board 2. The emitter electrode terminal 5E is electrically connected to the semiconductor chip 3 provided on the first major surface (front surface) of the circuit board 2.

The metal base 1 is soldered to the lower electrode 22 of the circuit board 2. The emitter electrode terminal 5E is soldered to the upper electrode 21 of the circuit board 2 and extends to the upper surface (first major surface) of the resin casing 6. The emitter electrode terminal 5E includes, in its upper portion, an electrode terminal bent portion 31 bent into a square U shape. A nut 11 and a nut holder 9 are housed inside the electrode terminal bent portion 31.

Likewise, the collector electrode terminal 5C and the signal terminal 5G, not shown, also extend to the upper surface (first major surface) of the resin casing 6. The collector electrode terminal 5C and the signal terminal 5G include, in their upper portion, an electrode terminal bent portion 31 bent into a square U shape. A nut 11 and a nut holder 9 are housed inside this electrode terminal bent portion 31.

The semiconductor chip 3 is electrically connected via bonding wires 4 to the electrode terminals including the emitter electrode terminal 5E, the collector electrode terminal 5C, and the signal terminal 5G. The emitter electrode terminal 5E, the collector electrode terminal 5C, and the signal terminal 5G are each soldered to the circuit board 2.

Here, the solder is made of a Pb-free solder. The bonding wire 4 has a relatively large diameter and is illustratively made of Al (aluminum), which is less expensive than Au (gold). The ceramic substrate 20 used for the circuit board 2 is illustratively made of AlN (aluminum nitride), which has good thermal conductivity. However, alternatively, $Al_2O_3$ (alumina), $Si_3N_4$ (silicon nitride), or SiC (silicon carbide) can also be used. The thermal conductivity of AlN (aluminum nitride) is 170-200 W/mK, larger than that of other ceramic substrate materials. The upper electrode 21 and the lower electrode 22 are illustratively made of Cu (copper). However, alternatively, Ni (nickel) can also be used.

The lower end portion of the resin casing 6 is in contact with the end portion of the metal base 1. The upper portion of the resin casing 6 is in contact with the outer end portion of the electrode terminal bent portion 31. A silicone gel 7 is provided so that its end portion is in contact with the end portion of the resin casing 6. The silicone gel 7 covers the upper surface (first major surface) of the metal base 1 and the side surface and the upper surface (first major surface) of the circuit board 2. A gap portion 8 is provided between the resin casing 6 and the silicone gel 7 and filled with e.g. air.

As shown in FIG. 3, in the power module 80, the upper end portion of the emitter electrode terminal 5E, the collector electrode terminal 5C, and the signal terminal 5G is exposed.

Here, the emitter electrode terminal 5E, the collector electrode terminal 5C, and the signal terminal 5G are illustratively made of Cu (copper), which has good thermal conductivity. The metal base 1 is formed by e.g. press working, and made of Cu (copper), which has good thermal conductivity. However, alternatively, a copper alloy, Al (aluminum), Ni (nickel), AlSiC (aluminum silicon carbide), or Mo (molybdenum) can also be used. The thermal conductivity of Cu (copper) is 393 W/mK, larger than that of other metals.

The resin casing 6 is illustratively made of PPS (polyphenylene sulfide) resin, which is a flame-retardant and heat-resistant resin. However, alternatively, unsaturated polyester resin can also be used.

In the power module 80 of this embodiment, no stress is applied to the soldering portion of the bent electrode terminal. Hence, weakening of the soldering portion can be suppressed. Thus, the occurrence of failures in TFT (thermal fatigue test) and TCT tests can be suppressed.

As shown in FIG. 4, in a power module 90 of a comparative example, the emitter electrode terminal 5Ea is soldered to the upper electrode 21, and then bent at a right angle using e.g. a specialized jig so that the emitter electrode terminal 5Ea is directed parallel to the upper surface of the resin casing 6. The power module 90 of the comparative example does not include the electrode terminal bent portion 31 of this embodiment.

When the emitter electrode terminal 5Ea is bent, as shown in FIG. 5, the terminal bending angle R is not a right angle, but varies in the range of e.g. 90° to 92°. Consequently, the relationship between the terminal height at the bending root H1 and the terminal height at the bending tip H2 is given as follows.

$$H1 < H2 \qquad (1)$$

Thus, variation occurs in the height dimensional tolerance of the electrode terminal.

As shown in FIG. 6, in the power module 90 of the comparative example, variation occurs in the height dimension of the electrode terminal, with a mean of 38.95 mm and a standard deviation of 0.32. This fails to satisfy the specification (e.g., user requirement specification 38±0.5 mm).

On the other hand, in the power module 80 of this embodiment, the electrode terminal is not bent after soldering, hence achieving a mean of 37.8 mm and a standard deviation of 0.11. This successfully satisfies the specification (e.g., user requirement specification 38±0.5 mm).

Figure 7:
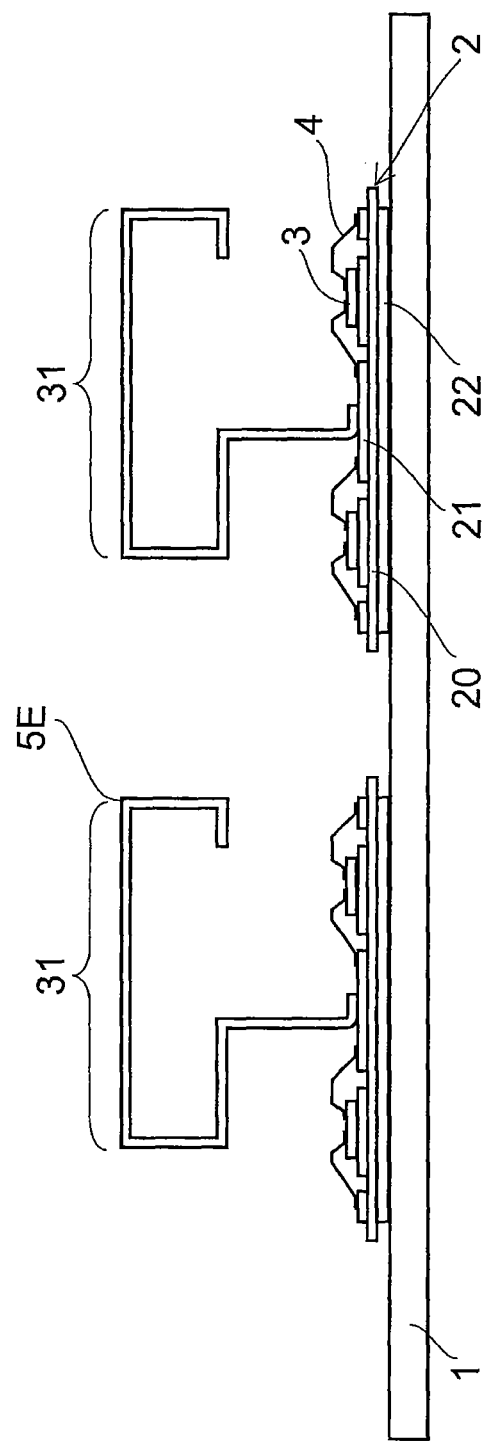
FIG. 7 is a cross-sectional view showing a process for manufacturing the power module according to the first embodiment of the invention.
Figure 8:
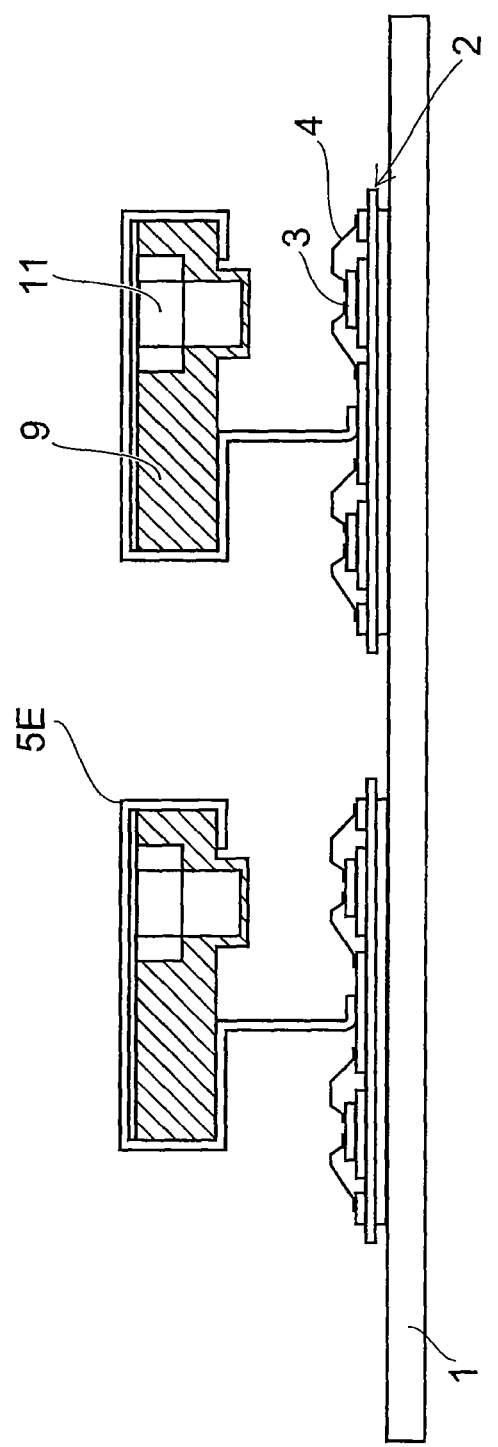
FIG. 8 is a cross-sectional view showing a process for manufacturing the power module according to the first embodiment of the invention.

Next, a method for manufacturing a power module is described with reference to FIGS. 7 and 8. FIGS. 7 and 8 are cross-sectional views showing a process for manufacturing a power module.

As shown in FIG. 7, first, a circuit board 2 is placed on a metal base 1 via solder, not shown. A semiconductor chip 3 is mounted on the circuit board 2. The upper electrode 21 of the circuit board 2 is electrically connected to the semiconductor chip 3 by a bonding wire 4. An emitter electrode terminal 5E including an electrode terminal bent portion 31 bent into a square U shape is placed on the upper electrode 21 of the circuit board 2 via solder. Here, with regard to the emitter electrode terminal 5E including the electrode terminal bent portion 31, the height dimension of the electrode terminal is measured beforehand to check whether the specification is satisfied. Those out of specification are not used.

After the emitter electrode terminal 5E is placed, solder reflowing is performed. Thus, the circuit board 2 is soldered onto the metal base 1, and the emitter electrode terminal 5E is soldered to the upper electrode 21 of the circuit board 2.

Next, as shown in FIG. 8, after a nut 11 is inserted into the nut holder 9, the nut and the nut holder 9 are inserted from the side surface of the electrode terminal bent portion 31 of the emitter electrode terminal 5E. Thus, the nut and the nut holder 9 are housed inside the electrode terminal bent portion 31.

Subsequently, a resin casing 6 is bonded to the metal base 1 with silicone resin, not shown. A silicone gel 7 is injected onto the side surface and the upper surface of the circuit board 2 so that a gap portion 8 is formed above the silicone gel 7. A cap, not shown, is attached. The metal base 1 and the circuit board 2 are fixed to the resin casing 6 with a casting material, not shown. By fixing with the casting material, vibration is prevented.

As described above, in the power module of this embodiment, a plurality of circuit boards 2 are mounted on the surface of the metal base 1. A semiconductor chip 3, which is an IGBT, is mounted on the surface of the circuit board 2. An emitter electrode terminal 5E, a collector electrode terminal 5C, and a signal terminal 5G are provided and electrically connected to the semiconductor chip 3 provided on the surface of the circuit board 2. The emitter electrode terminal 5E, the collector electrode terminal 5C, and the signal terminal 5G include, in their upper portion, an electrode terminal bent portion 31 bent into a square U shape. The emitter electrode terminal 5E, the collector electrode terminal 5C, and the signal terminal 5G are each soldered to the upper electrode 21 of the circuit board 2 and extend to the upper surface of the resin casing 6. A nut 11 and a nut holder 9 are housed inside the electrode terminal bent portion 31.

Thus, the flatness of the electrode terminal can be improved, and the height dimensional accuracy can be improved. Furthermore, tensile stress on the soldering portion at the time of screwing can be reduced. Thus, the reliability of the soldering portion can be improved.

In this embodiment, the semiconductor chip mounted on the power module is an IGBT. However, alternatively, a power MOSFET, GTO, or SIT can also be used. Furthermore, semiconductor chips of different device types, such as an IGBT and a power MOS transistor, can be used in combination. Furthermore, Pb—Sn eutectic solder can be used instead of Pb-free solder.

Second Embodiment

Figure 9:
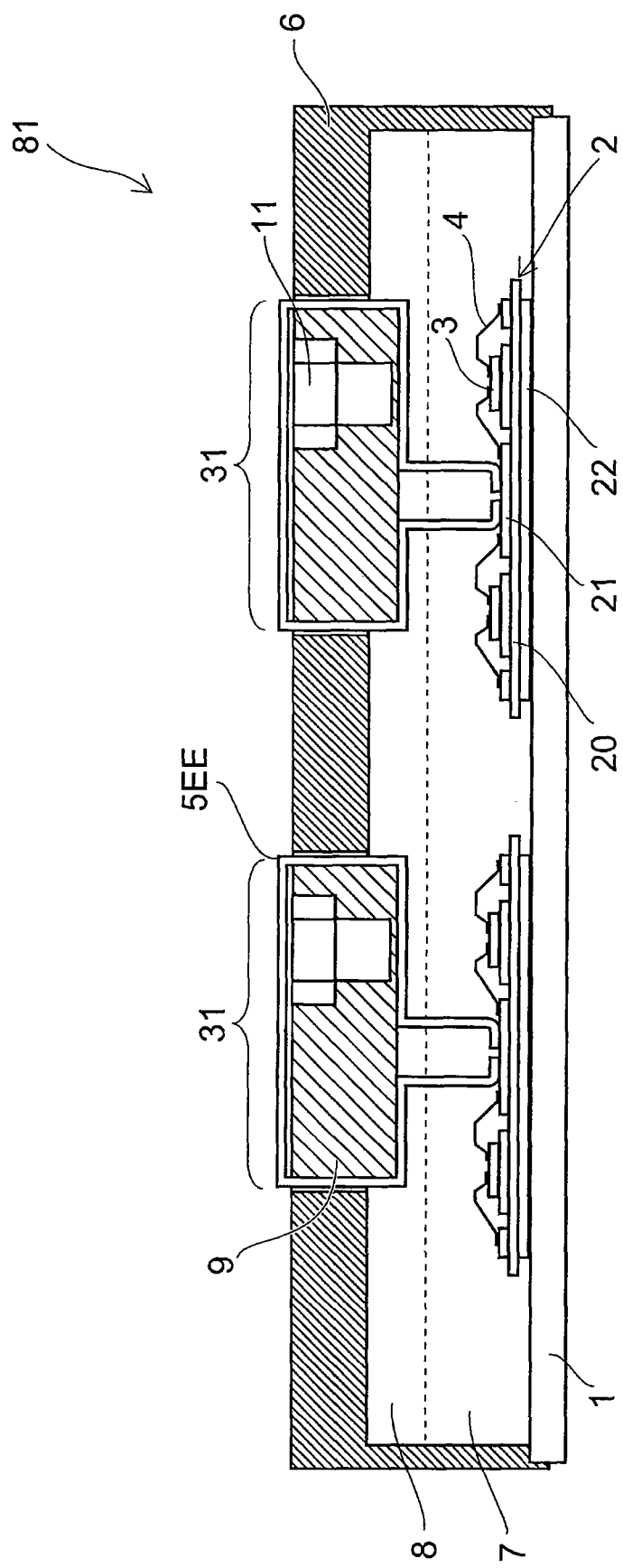
FIG. 9 is a cross-sectional view showing a power module according to a second embodiment of the invention.

Next, a power module according to a second embodiment of the invention is described with reference to the drawings. FIG. 9 is a cross-sectional view showing the power module. In this embodiment, the shape of the electrode terminal is changed.

In the following, the same constituent portions as those in the first embodiment are labeled with like reference numerals, with the description thereof omitted, and only the different portions are described.

As shown in FIG. 9, the power module 81 includes an emitter electrode terminal 5EE. The emitter electrode terminal 5EE includes an electrode terminal bent portion 31 bent into a square U shape. One end and another end (first connecting portion and second connecting portion) of the emitter electrode terminal 5EE are provided to extend perpendicularly to the electrode terminal bent portion 31.

The emitter electrode terminal 5EE is soldered to the upper electrode 21 of the circuit board 2 at two positions (the one end and the another end, or the first connecting portion and second connecting portion) and extends to the upper surface (first major surface) of the resin casing 6. A nut 11 and a nut holder 9 are housed inside the electrode terminal bent portion 31.

Likewise, a collector electrode terminal and a signal terminal, not shown, also extend to the upper surface (first major surface) of the resin casing 6. The collector electrode terminal and the signal terminal include, in their upper portion, an electrode terminal bent portion 31 bent into a square U shape. A nut 11 and a nut holder 9 are housed inside this electrode terminal bent portion 31.

Figure 10:
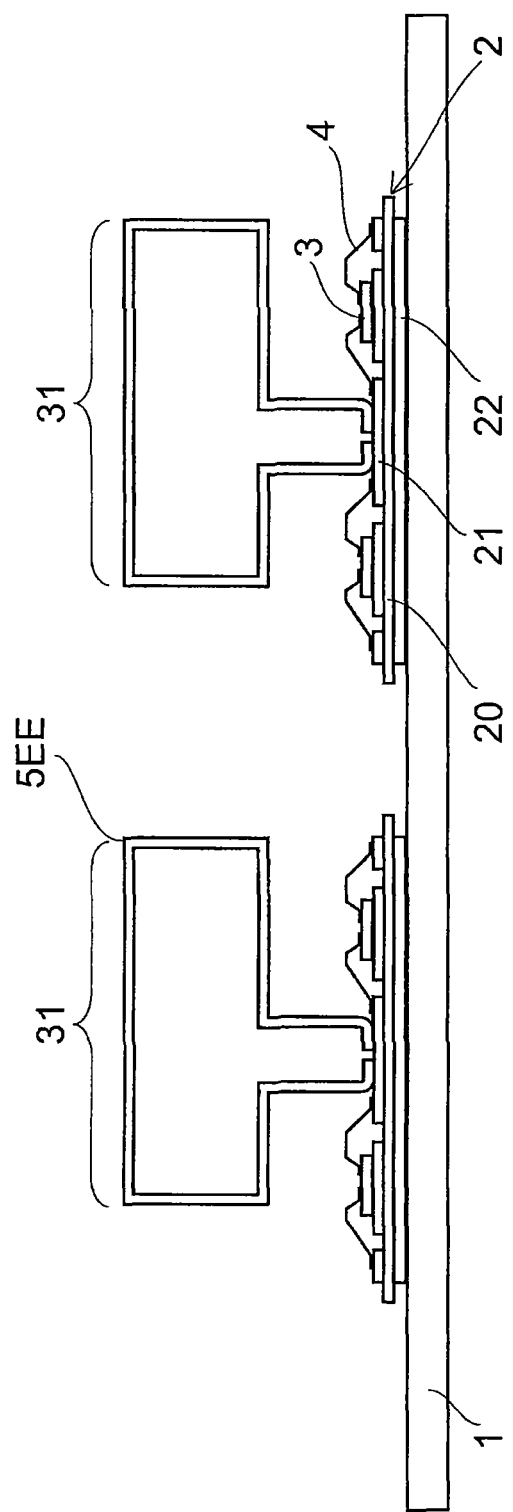
FIG. 10 is a cross-sectional view showing a process for manufacturing the power module according to the second embodiment of the invention.
Figure 11:
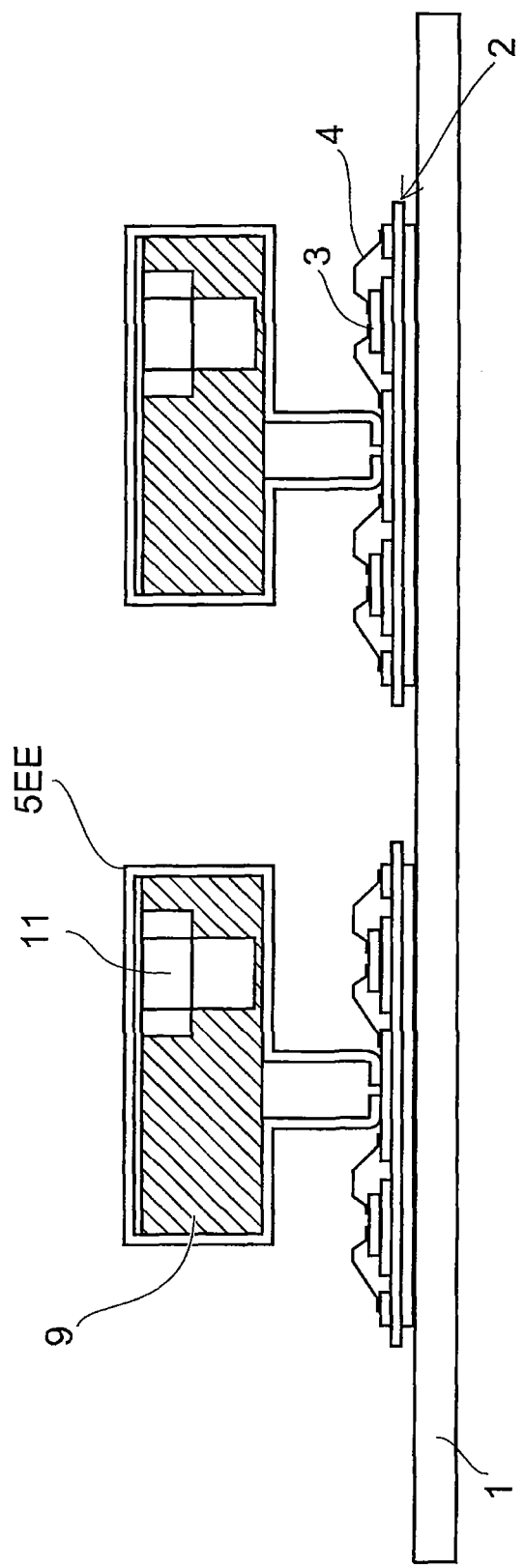
FIG. 11 is a cross-sectional view showing a process for manufacturing the power module according to the second embodiment of the invention.

Next, a method for manufacturing a power module is described with reference to FIGS. 10 and 11. FIGS. 10 and 11 are cross sectional views showing a process for manufacturing a power module.

As shown in FIG. 10, an emitter electrode terminal 5EE including an electrode terminal bent portion 31 bent into a square U shape is placed on the upper electrode 21 of the circuit board 2 via solder. Here, with regard to the emitter electrode terminal 5EE including the electrode terminal bent portion 31, the height dimension of the electrode terminal is measured beforehand to check whether the specification is satisfied. Those out of specification are not used.

After the emitter electrode terminal 5EE is placed, solder reflowing is performed. Thus, the circuit board 2 is soldered onto the metal base 1, and the emitter electrode terminal 5EE is soldered to the upper electrode 21 of the circuit board 2.

Next, as shown in FIG. 11, after a nut 11 is inserted into the nut holder 9, the nut and the nut holder 9 are inserted from the side surface of the electrode terminal bent portion 31 of the emitter electrode terminal 5EE. Thus, the nut and the nut holder 9 are housed inside the electrode terminal bent portion 31. The subsequent process is similar to that of the first embodiment, and hence the description thereof is omitted.

As described above, in the power module of this embodiment, a plurality of circuit boards 2 are mounted on the surface of the metal base 1. A semiconductor chip 3, which is an IGBT, is mounted on the surface of the circuit board 2. An emitter electrode terminal 5EE is provided and electrically connected to the semiconductor chip 3 provided on the surface of the circuit board 2. The emitter electrode terminal 5EE includes, in its upper portion, an electrode terminal bent portion 31 bent into a square U shape. The one end and the another end of the emitter electrode terminal 5EE are provided to extend perpendicularly to the electrode terminal bent portion 31. The emitter electrode terminal 5EE is soldered to the upper electrode 21 of the circuit board 2 and extends to the upper surface of the resin casing 6. A nut 11 and a nut holder 9 are housed inside the electrode terminal bent portion 31.

Thus, the flatness of the electrode terminal can be improved, and the height dimensional accuracy can be improved. Furthermore, tensile stress on the soldering portion at the time of screwing can be reduced. Thus, the reliability of the soldering portion can be improved. Furthermore, because the number of soldering positions between the electrode terminal and the upper electrode is larger, the soldering strength can be made higher than that in the first embodiment.

The invention is not limited to the above embodiments, but may be variously modified without departing from the spirit of the invention.

In the embodiments, a gap portion 8 is provided between the silicone gel 7 and the resin casing 6. However, instead, the gap portion 8 may be filled with resin such as epoxy resin.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A power module comprising: a metal base; an electrode terminal including a bent portion bent into a square U shape;

a nut and a nut holder housed inside the bent portion of the electrode terminal, the nut holder having a pair of major surfaces including a first surface and a second surface positioned opposite to the first surface, wherein the bent portion covers and is in direct contact with the first surface and the second surface; a circuit board having a first major surface with a semiconductor chip mounted on the circuit board, the circuit board having an upper electrode on the first major surface, the upper electrode being electrically connected to the semiconductor chip and soldered to one end of the electrode terminal located away from the bent portion, the circuit board having a lower electrode on a second major surface opposite to the first major surface, and the lower electrode being soldered to the metal base; and a casing having a lower end portion in contact with an end portion of the metal base, the casing having an upper portion in contact with an outer surface of the bent portion of the electrode terminal, and the casing being spaced from the circuit board and provided so as to cover the circuit board.

2. The module according to claim 1, wherein the metal base is made of Cu (copper), Al (aluminum), Ni (nickel), AlSiC (aluminum silicon carbide), or Mo (molybdenum).

3. The module according to claim 1, wherein the one end and another end of the electrode terminal located away from the bent portion are soldered to the upper electrode.

4. A power module comprising: a metal base; an electrode terminal including a bent portion bent into a square U shape; a nut and a nut holder housed inside the bent portion of the electrode terminal, the nut holder having a pair of major surfaces including a first surface and a second surface positioned opposite to the first surface, wherein the bent portion covers and is in direct contact with the first surface and the second surface; a circuit board including an upper electrode, a ceramic substrate, and a lower electrode, the circuit board having a first major surface with a semiconductor chip mounted on the circuit board, one end of the electrode terminal located away from the bent portion being soldered to the upper electrode, the one end of the electrode terminal located away from the bent portion being electrically connected to the semiconductor chip, the lower electrode on a second major surface opposite to the first major surface being soldered to the metal base; a silicone gel provided so as to cover a first major surface of the metal base and the first major surface and a side surface of the circuit board; a resin casing having a lower end portion in contact with an end portion of the metal base and an end portion of the silicone gel, the resin casing having an upper portion in contact with an outer surface of the bent portion of the electrode terminal, and the resin casing being provided so as to cover the silicone gel; and a gap portion provided between the resin casing and the silicone gel.

5. The module according to claim 4, wherein the ceramic substrate is made of AlN (aluminum nitride), $Al_2O_3$ (alumina), $Si_3N_4$ (silicon nitride), or SiC (silicon carbide).

6. A power module comprising: a metal base; a ceramic substrate having a first major surface and a second major surface opposite to the first major surface, the second major surface being connected to an upper surface of the metal base via a lower electrode; a semiconductor chip located on the first major surface of the ceramic substrate; a nut holder enclosing a nut and having a pair of major surfaces including a first surface and a second surface positioned opposite to the first surface; an electrode terminal including a bent portion, the nut holder being provided inside the bent portion so that the first surface and the second surface outer periphery of the nut holder are surrounded by the bent portion from one end to another end of the bent portion and in direct contact therein, the electrode terminal including a first connecting portion extending perpendicularly to the bent portion from the one end of the bent portion, and the first connecting portion being located on the first major surface of the ceramic substrate via an upper electrode and electrically connected to the semiconductor chip; and a casing including an upper plate having an opening and an annular side plate extending downward from an edge of the upper plate, the casing being bonded to an outer end portion of a first major surface of the metal base at an end of the side plate on opposite side from the upper plate, and the casing enclosing the semiconductor chip and the electrode terminal, an upper end portion of the bent portion of the electrode terminal being exposed to outside of the casing through the opening.

7. The module according to claim 6, wherein the bent portion of the electrode terminal is inserted into the opening of the upper plate of the casing.

8. The module according to claim 7, wherein the semiconductor chip is electrically connected to the electrode terminal by bonding the semiconductor chip to the upper electrode with a bonding wire.

9. The module according to claim 7, wherein the first connecting portion of the electrode terminal is soldered to the upper electrode.

10. The module according to claim 7, wherein the metal base is made of one of copper, copper alloy, aluminum, nickel, aluminum silicon carbide, and molybdenum.

11. The module according to claim 7, wherein the casing is made of polyphenylene sulfide or unsaturated polyester resin.

12. The module according to claim 7, wherein the semiconductor chip is one of IGBT, power MOSFET, GTO, and SIT.

13. The module according to claim 7, further comprising:
a second connecting portion extending perpendicularly to the bent portion from the another end of the bent portion of the electrode terminal and located on the first major surface of the ceramic substrate via the upper electrode.

14. The module according to claim 9, further comprising:
a silicone gel covering the upper surface of the metal base, the first major surface of the ceramic substrate, and a surface of the semiconductor chip, the silicone gel enclosing the first connecting portion of the electrode terminal and being in contact with inside of the side plate of the casing.

15. The module according to claim 13, wherein the first connecting portion and the second connecting portion are opposed to each other.

16. The module according to claim 14, wherein a gap exists between a lower surface of the upper plate of the casing and the silicone gel.

17. The module according to claim 15, wherein the semiconductor chip is electrically connected to the electrode terminal by bonding the semiconductor chip to the upper electrode with a bonding wire.

18. The module according to claim 15, wherein the first connecting portion and the second connecting portion of the electrode terminal are soldered to the upper electrode.

19. The module according to claim 16, wherein the gap is filled with epoxy resin.

20. The module according to claim 18, further comprising:
a silicone gel covering the upper surface of the metal base, the first major surface of the ceramic substrate, and a surface of the semiconductor chip, the silicone gel enclosing the first connecting portion and the second connecting portion of the electrode terminal and being in contact with inside of the side plate of the casing.

* * * * *